United States Patent
Lee et al.

(10) Patent No.: US 12,523,942 B2
(45) Date of Patent: *Jan. 13, 2026

(54) EXPOSURE METHOD AND EXPOSURE APPARATUS

(71) Applicant: TAIWAN SEMICONDUCTOR MANUFACTURING COMPANY, LTD., Hsinchu (TW)

(72) Inventors: Yung-Yao Lee, Hsinchu (TW); Heng-Hsin Liu, Hsinchu (TW); Hung-Ming Kuo, Hsinchu (TW); Jui-Chun Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 512 days.

This patent is subject to a terminal disclaimer.

(21) Appl. No.: 17/986,823

(22) Filed: Nov. 14, 2022

(65) Prior Publication Data

US 2023/0076566 A1 Mar. 9, 2023

Related U.S. Application Data

(63) Continuation of application No. 16/994,804, filed on Aug. 17, 2020, now Pat. No. 11,500,299, which is a
(Continued)

(51) Int. Cl.
*G03F 9/00* (2006.01)
*G03F 7/00* (2006.01)
(Continued)

(52) U.S. Cl.
CPC .......... *G03F 9/7046* (2013.01); *G03F 7/2006* (2013.01); *G03F 7/70433* (2013.01);
(Continued)

(58) Field of Classification Search
CPC .. G03F 9/7046; G03F 7/2006; G03F 7/70433; G03F 7/70525; G03F 7/7055;
(Continued)

(56) References Cited

U.S. PATENT DOCUMENTS 8,796,666 B1 8/2014 Huang et al.
9,093,530 B2 7/2015 Huang et al.
(Continued)

FOREIGN PATENT DOCUMENTS

CN 103513516 A 1/2014
JP 2011-040661 A 2/2011
(Continued)

OTHER PUBLICATIONS

Non-Final Office Action Issued in related U.S. Appl. No. 15/906,560, dated Nov. 30, 2018.
(Continued)

*Primary Examiner* — Stewart A Fraser
(74) *Attorney, Agent, or Firm* — STUDEBAKER BRACKETT PLLC

(57) ABSTRACT

In a method executed in an exposure apparatus, a focus control effective region and a focus control exclusion region are set based on an exposure map and a chip area layout within an exposure area. Focus-leveling data are measured over a wafer. A photo resist layer on the wafer is exposed with an exposure light. When a chip area of a plurality of chip areas of the exposure area is located within an effective region of a wafer, the chip area is included in the focus control effective region, and when a part of or all of a chip area of the plurality of chip areas is located on or outside a periphery of the effective region of the wafer, the chip area is included in the focus control exclusion region In the exposing, a focus-leveling is controlled by using the focus-leveling data measured at the focus control effective region.

20 Claims, 10 Drawing Sheets

Related U.S. Application Data continuation of application No. 15/906,580, filed on Feb. 27, 2018, now Pat. No. 10,747,128.

(60) Provisional application No. 62/586,641, filed on Nov. 15, 2017.

(51) Int. Cl.
*G03F 7/20* (2006.01)
*H01L 21/027* (2006.01)
*H01L 21/66* (2006.01)
*H01L 21/67* (2006.01)

(52) U.S. Cl.
CPC ........ *G03F 7/70525* (2013.01); *G03F 7/7055* (2013.01); *G03F 7/70641* (2013.01); *G03F 9/7023* (2013.01); *G03F 9/7026* (2013.01); *G03F 9/7034* (2013.01); *G03F 9/7003* (2013.01); *H01L 21/0274* (2013.01); *H01L 21/67259* (2013.01); *H01L 22/12* (2013.01)

(58) Field of Classification Search
CPC .. G03F 7/70641; G03F 9/7023; G03F 9/7026; G03F 9/7034; G03F 7/2028; G03F 7/70425

See application file for complete search history.

(56) References Cited

U.S. PATENT DOCUMENTS

| | | | |
|---|---|---|---|
| 9,134,633 B2 | 9/2015 | Lin et al. | |
| 9,230,867 B2 | 1/2016 | Cheng et al. | |
| 9,304,403 B2 | 4/2016 | Lin et al. | |
| 9,404,743 B2 | 8/2016 | Chiu et al. | |
| 9,548,303 B2 | 1/2017 | Lee et al. | |
| 9,823,585 B2 | 11/2017 | Shih et al. | |
| 9,841,687 B2 | 12/2017 | Lee et al. | |
| 9,859,139 B2 | 1/2018 | Cheng et al. | |
| 10,012,912 B2 | 7/2018 | Hatakenaka | |
| 10,747,128 B2 | 8/2020 | Lee et al. | |
| 11,500,299 B2 * | 11/2022 | Lee | G03F 7/2006 |
| 2011/0045613 A1 | 2/2011 | Suzuki | |
| 2013/0335719 A1 | 12/2013 | Hatakenaka | |
| 2015/0332951 A1 | 11/2015 | Male et al. | |
| 2018/0335688 A1 | 11/2018 | Arimatsu | |

FOREIGN PATENT DOCUMENTS

| | | |
|---|---|---|
| JP | 2014-003088 A | 1/2014 |
| WO | 2004/099874 A1 | 11/2004 |
| WO | 2018/015113 A1 | 1/2018 |

OTHER PUBLICATIONS

Final Office Action issued in related U.S. Appl. No. 15/906,580, dated Jun. 10, 2019.
Non-Final Office Action issued in related U.S. Appl. No. 15/906,580, dated Aug. 16, 2019.
Final Office Action issued in related U.S. Appl. No. 15/906,580, dated Feb. 18, 2020.
Notice of Allowance issued in related U.S. Appl. No. 15/906,580, dated Apr. 8, 2020.
Non-Final Office Action issued in related U.S. Appl. No. 16/994,804, dated Mar. 31, 2022.
Notice of Allowance issued in related U.S. Appl. No. 16/994,804, dated Jul. 19, 2022.

* cited by examiner

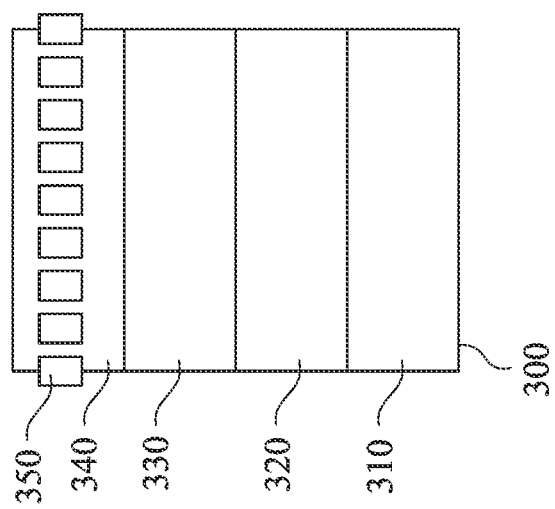
FIG. 3C
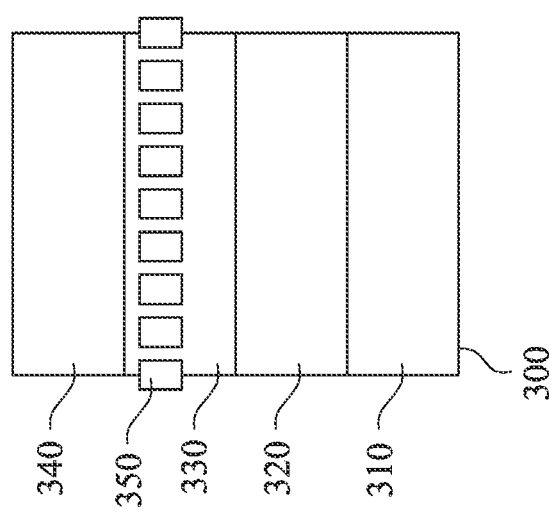
FIG. 3B
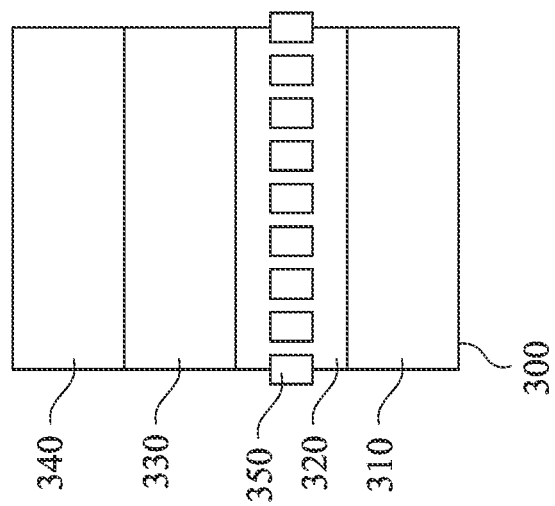
FIG. 3A
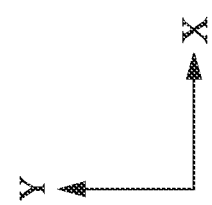

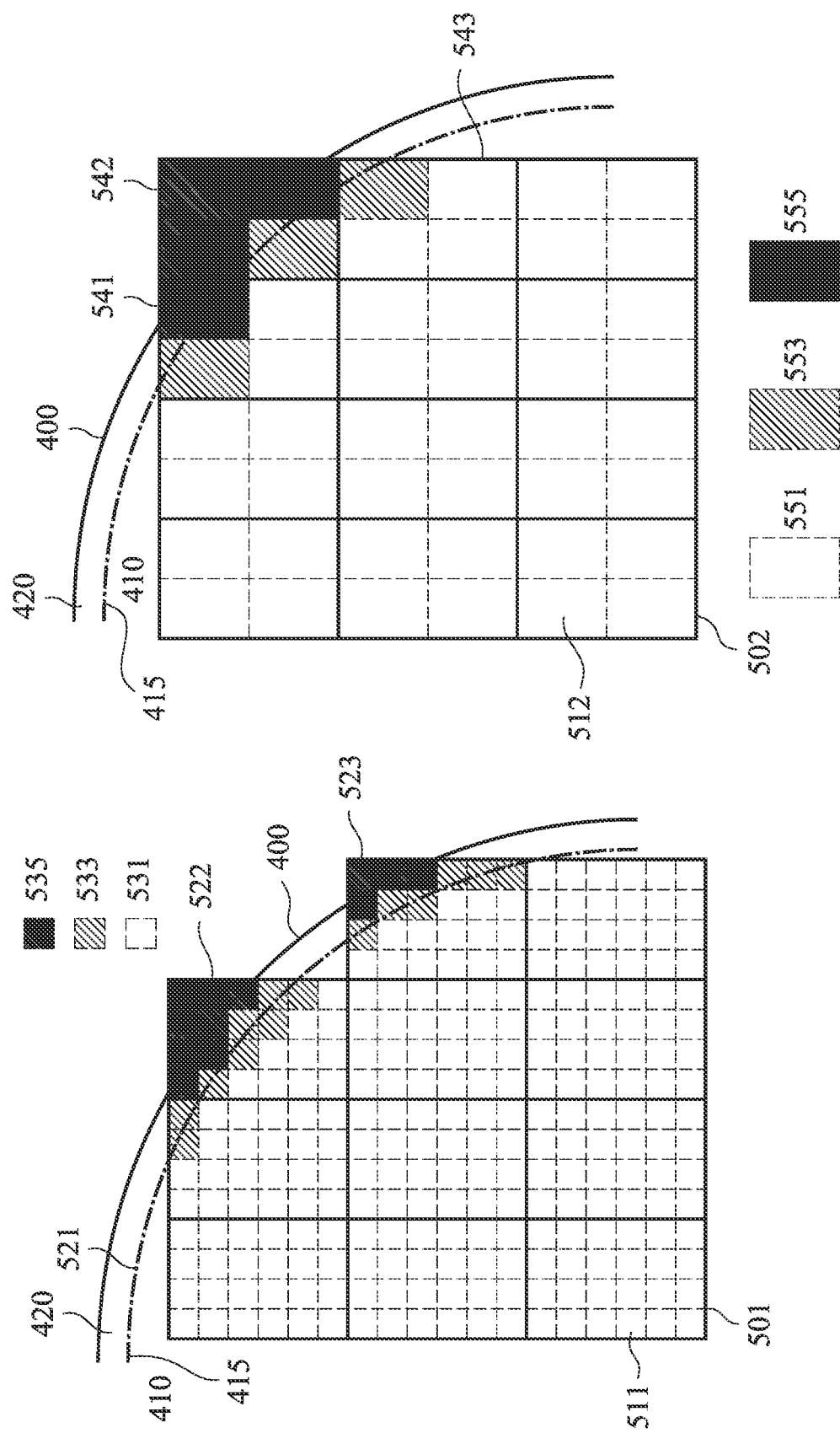

EXPOSURE METHOD AND EXPOSURE APPARATUS

CROSS-REFERENCE TO RELATED APPLICATIONS

This application is a continuation of U.S. patent application Ser. No. 16/994,804, filed Aug. 17, 2020, now U.S. Pat. No. 11,500,299, which is a continuation of U.S. patent application Ser. No. 15/906,580, filed Feb. 27, 2018, now U.S. Pat. No. 10,747,128, which claims priority to U.S. Provisional Patent Application 62/586,641, filed Nov. 15, 2017, the entire disclosures of which are incorporated herein by reference.

TECHNICAL FIELD

The disclosure relates to a patterning method and an apparatus for fabricating resist patterns in device manufacturing, such as an integrated circuit, more particularly to a lithography process and lithography apparatus, such as a scanner and a stepper.

BACKGROUND

As the semiconductor industry introduces new generations of integrated circuits (ICs) having higher performance and greater functionality, the density of the elements that form the ICs is increased, while the dimensions and spacing between components or elements of the ICs are reduced. As components become smaller and patterning techniques become more precise, a precise focus and/or leveling control during the exposure operation has been required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B and 3C show a concept of measuring and controlling focus-leveling related to embodiments of the present disclosure.

FIGS. 5A and 5B show a concept of measuring and controlling focus-leveling related to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

In the step-and-scan exposure system, the region where the patterns on the photo mask is projected on to the wafer by one scan (i.e., an exposure area or an exposure field) is limited, and the exposing scan is repeated by driving the wafer stage to move the wafer sequentially according to an exposure map on the wafer. In such an exposure system a highly precise focus control is required.

Figure 1:
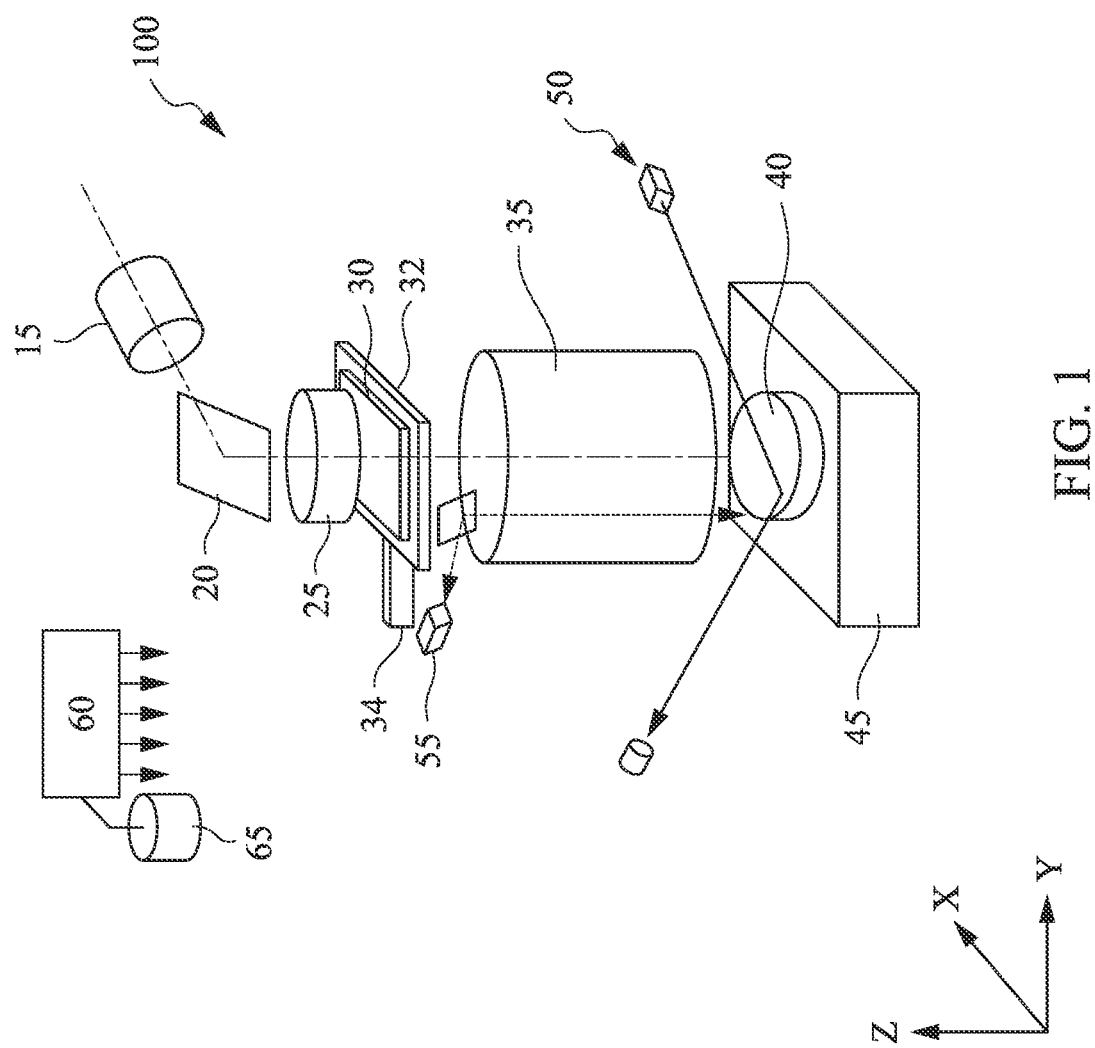
FIG. 1 shows a schematic view of an exposure apparatus related to embodiments of the present disclosure.

FIG. 1 shows an exemplary exposure apparatus related to embodiments of the present disclosure. The exposure apparatus 100 is a projection optical exposure apparatus, for example, an optical scanner or an optical stepper used for a lithography process in a fabrication of a semiconductor device or a flat panel display. Further, the exposure apparatus 100 can be a local liquid immersion exposure apparatus that performs exposure in a state where a space between a lower surface of an optical system and a wafer surface is locally filled with a liquid.

The exposure apparatus 100 includes, among other features, a light source 15, for example, a KrF excimer laser system or an ArF excimer laser system, one or more mirrors 20, a condenser lens 25, a photo mask stage 32 that holds a photo mask (reticle) 30, a wafer stage 45, a projection lens system 35, a wafer alignment measurement system 55, a focus-leveling measurement and control system 50, and a controller 60. The controller 60 includes one or more processing circuits, such as a CPU or a microprocessor, and one or more storage devices (memory) 65, such as a hard disk drive or a flash memory. The controller 60, by executing one or more control programs stored in the storage device 65 by the processing circuit, controls operations of the exposure apparatus 100 according to the control program.

As shown in FIG. 1, the Z direction is parallel an optical axis AX of a projection lens system 35, the Y direction is the direction in which a photo mask 30 and a wafer 40 are relatively scanned, and the X direction is the direction orthogonal to the Z direction and the Y direction.

When the exposure apparatus 100 is an optical scanner, a slit-shaped illumination area which is set over the photo mask 30 with a reticle blind is illuminated by the illumination light (exposure light) emitted from the light source 15. The photo mask 30, on which a circuit pattern is formed as transparent or opaque patterns, is held on the mask stage 32. The mask stage 32 can be precisely driven within the XY plane, and can also be moved in the predetermined scanning direction (Y direction), by mask stage driving mechanism 34. The projection lens system 35 projects illumination light passing through the photo mask 30 on to the wafer 40 placed on a wafer stage 45. By synchronous driving of the mask stage 32 and the wafer stage 45, which relatively moves the mask stage 32 in the scanning direction (+Y direction) and moves the wafer stage 45 on which the wafer 40 to be exposed is placed, in opposing the scanning direction (-Y direction). By this scanning movement, a band of illumination light is scanned in an exposure area on the wafer to form a mask pattern image on/in a photo resist layer coated on the wafer 40.

Figure 2:
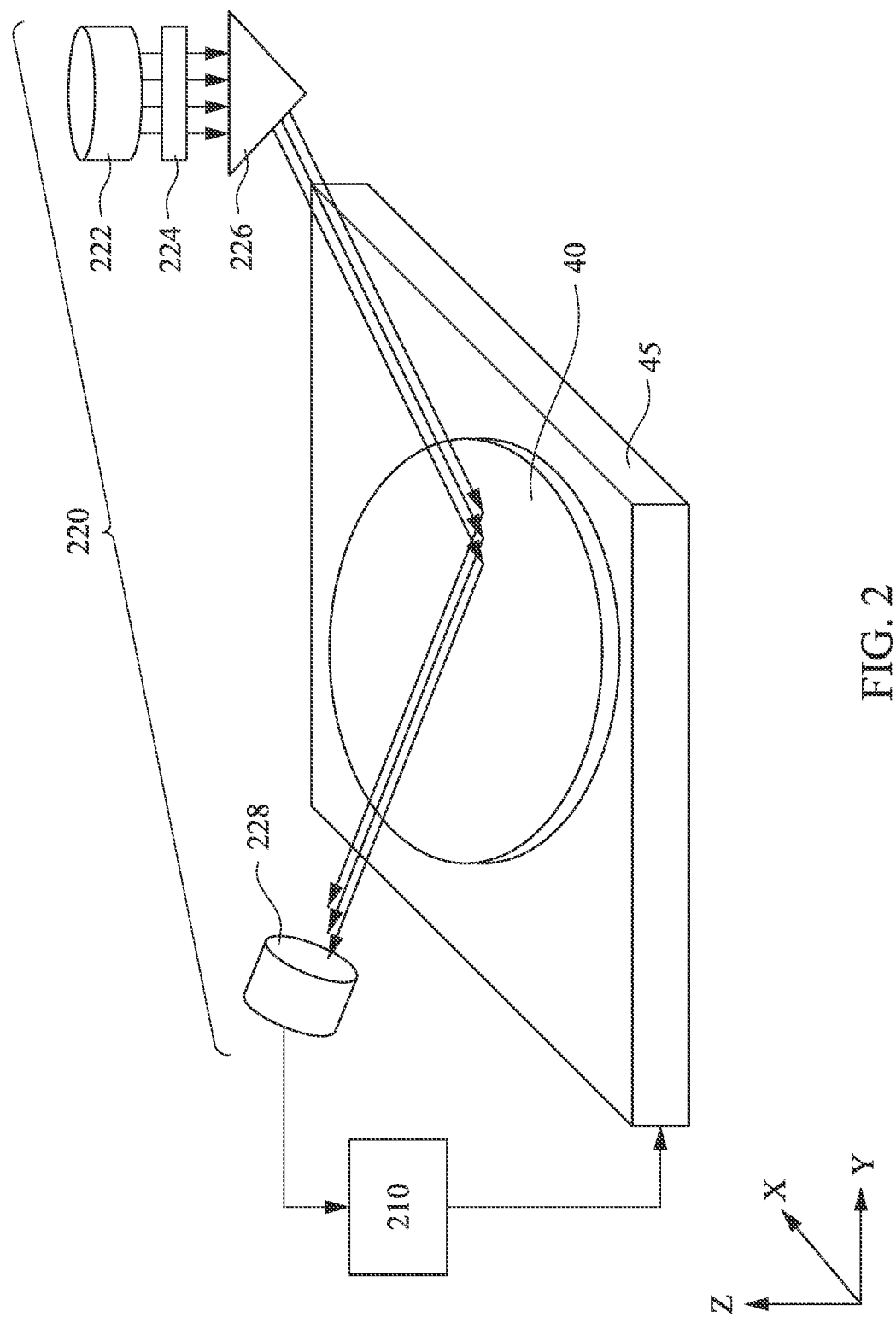
FIG. 2 shows a schematic view of a focus-leveling measurement system related to embodiments of the present disclosure.

FIG. 2 shows a schematic configuration of a focus-leveling measurement and control system 50 of the exposure system 100.

The focus-leveling measurement and control system 50 includes an autofocus control system 210 and a leveling measuring system 220. In some embodiments of the present disclosure, a focus measurement measures a height of the surface of the wafer, and a leveling measurement measures a tilt of the exposure area. Further, a focus-leveling control/measurement means controls or measures both the focus (height) and the leveling (tilt).

The leveling measuring system 220 includes a light source 222 for emitting, e.g., broadband light, a multi slit unit 224, a first optical system 226, and a second optical system (light receiving part) 228. The second optical system 228 performs photoelectric conversion of the input light spots and outputs the information on two-dimensional light intensity.

The autofocus control system 210 receives information on two-dimensional light intensity from the second optical system 228. By using the information on two-dimensional light intensity, the autofocus control system calculates a height of the surface of the exposure area (photo resist layer) and a tilt of the exposure area, and then calculates a direction of the controlled variable of the wafer stage 45, an adjustment amount of the Z direction of the wafer stage 45, and/or a direction and an amount of inclination adjustment of the wafer stage 45. The wafer stage 45 is controlled accordingly during the exposure (scanning). To determine the plane of the surface of the exposure area, at least 3 measuring points (light spots) are necessary. In some embodiments, 6-12 points are measured to determine the tilt of the exposure area.

In the exposure operation, a wafer 40, such as a semiconductor wafer or a glass plate for a flat panel display, is loaded on the wafer stage 45. Unless the wafer 40 has no underlying pattern, the wafer alignment measurement system 55 detects, by using a laser beam, alignment patterns formed by the underlying patterns. For example, the wafer 40 has a plurality of exposure areas arranged in the X direction and the Y direction as a matrix, and each exposure area includes one or more areas corresponding to a semiconductor chip. The alignment patterns include an alignment pattern for the X direction and an alignment pattern for the Y direction, arranged in a scribe lane between chips in some embodiments. Based on the alignment measurement result, the wafer 40 (wafer stage 45) is moved to a predetermined position under the projection lens 35, and the first exposure area in the wafer 40 is exposed with the laser light. Then, the wafer 40 is moved so that the next exposure area is exposed. Such moving and exposing are repeated until all of the exposure areas in the wafer 40 are exposed. Before and during the exposure, the focus value (the stage height) and a leveling value (tilt of the stage) are controlled. Then, the exposed wafer 40 is unloaded and the next wafer is loaded to be exposed.

In some embodiments, the focus-leveling measurement is performed just before the exposure. FIGS. 3A-3C show a focus-leveling measurement operation related to embodiments of the present disclosure. For the purpose of explanation, it is assumed that one exposure area 300 is divided into four exposure sub-areas. In FIGS. 3A-3C, the scanning is performed along the Y direction. When the first area 310 is exposed (scanned), the leveling measurement for the second area 320 is performed by the measurement light beams 350. Then, the exposure for the second area 320 is performed with focus-leveling controlled by using the leveling measurement results for the second area 320. When the second area 320 is exposed (scanned), the leveling measurement for the third area 330 is performed. Then, the exposure for the third area 330 is performed with focus-leveling controlled by using the leveling measurement results for the third area 330. When the third area 330 is exposed (scanned), the leveling measurement for the fourth area 340 is performed. In the actual exposure system, the scanning is performed in a continuous manner and the focus-leveling measurements are also performed continuously or dynamically.

In FIGS. 3A-3C, the measurement light beams 350 (e.g., nine light beams) are all located in the exposure area in the X direction. However, when the exposure area in the X direction is smaller, one or more of the measurement light beams 350 are not utilized.

In other embodiments, the focus-leveling measurement is performed for the entire wafer and the measured results are stored in a memory. In exposing a given exposure area, the pre-measured focus-leveling data is read out from the memory, and the exposure (scan) for the given exposure area is performed with focus-leveling controlled.

When an exposure area is located sufficiently within inside the wafer, the exposure area is exposed with the exposure light while precisely controlling the focus and leveling by using the measured focus-leveling data. However, for exposure areas located near the outer periphery of the wafer, a part of the exposure area is located at "a focus control exclusion region" and the exposure areas located in the focus control exclusion region may be exposed without precisely controlling the focus and leveling, because a part of the focus-leveling data is not used. In such a case, the exposed area without precisely controlling the focus and leveling is subjected to a defocus risk, and semiconductor chips corresponding to such area would become "bad" chips.

Figure 4:
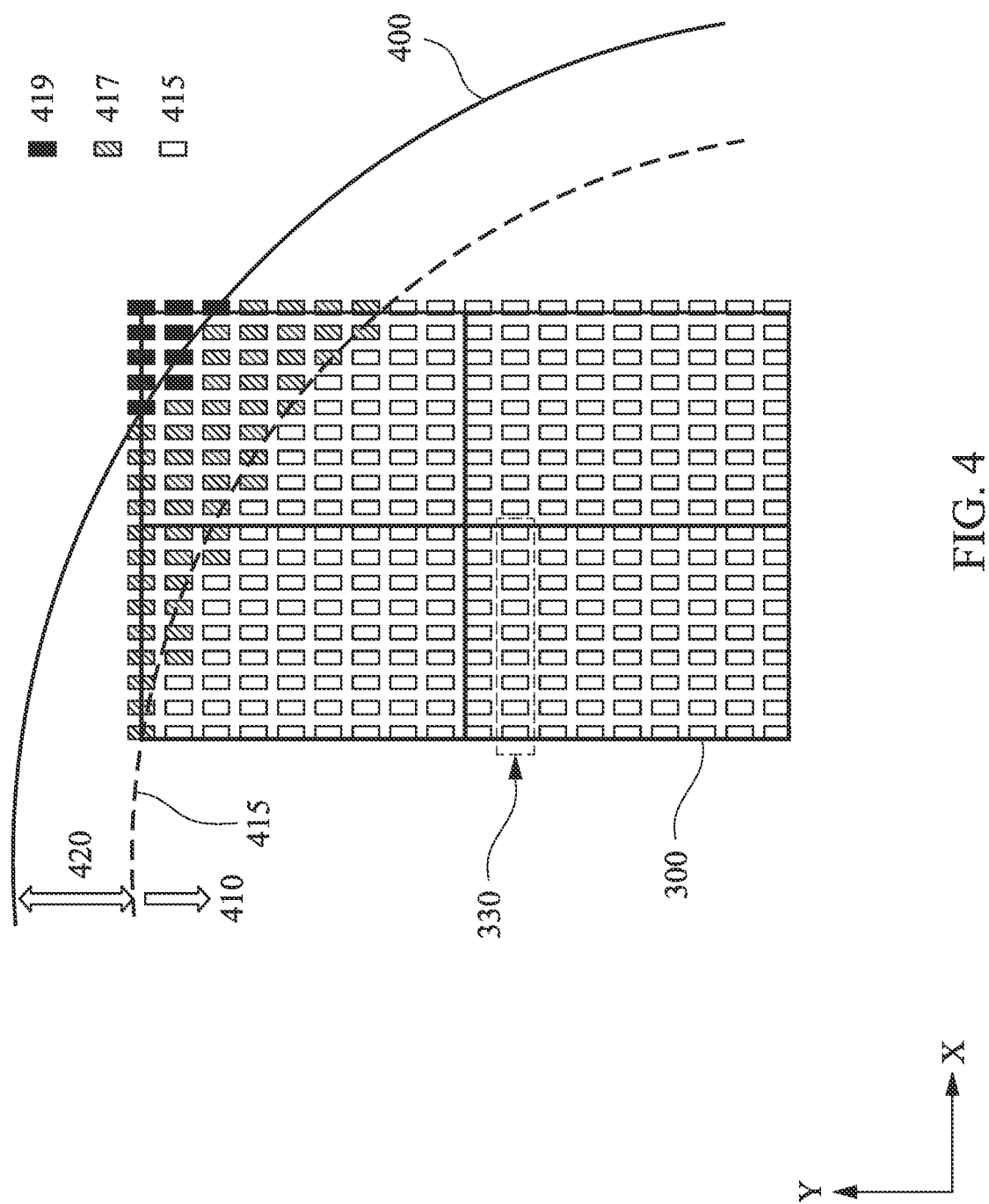
FIG. 4 shows a concept of measuring and controlling focus-leveling related to embodiments of the present disclosure.

FIG. 4 shows a concept of the focus control effective region and the focus control exclusion region. In FIG. 4, the boundary 415 between the focus control effective region 410 and the focus control exclusion region 420 has a circular shape having the center thereof coinciding with the center of the wafer 400. As shown in FIGS. 3A-3C and 4, the focus-leveling measurement utilizes multiple light beams 330, for example, nine light beams (spots) arranged in the X direction, as a group of measurement light beams. Although FIG. 4 shows discrete light beams along the Y direction, the focus-leveling measurement light beams 330 are scanned by moving the wafer stage relative to the wafer 400.

When the entire group of measurement light beams 330 (nine light beams along the X direction) is within the focus control effective region 410 generating valid focus-leveling data, the focus-leveling control is performed by using the valid focus-leveling data. In contrast, when a part of the group of measurement light beams 330 is located outside the focus control effective region 410, i.e., in the focus control exclusion region 420, the focus-leveling measurement data corresponding to the focus control exclusion region 420 become invalid focus-leveling data 417 and 419 in some embodiments. In other embodiments, the focus-leveling measurement for the focus control exclusion region 420 is not performed or measurement data for the focus control exclusion region 420 are not stored. In some embodiments, when the part of the group of measurement light beams is located in the focus control exclusion region 420, all focus-leveling measurement data in the group become invalid focus-leveling measurement data. The invalid focus-leveling measurement data is not utilized in the focus-leveling control, and thus this may generate a defocus issue. As shown in FIG. 4, the invalid focus-leveling data includes first invalid focus-leveling data 417 and second invalid focus-leveling data 419. The first invalid focus-leveling data 417 are for the focus control exclusion region 420 within the outer boundary of the wafer 400, and the second invalid focus-leveling data 419 are for the region outside the outer boundary of the wafer 400.

In general, one exposure area 300 includes multiple chip areas having substantially the same circuit patterns. For example, FIG. 5A shows the case where one exposure area 501 includes 4×6 (24) chip areas 511, and FIG. 5B shows the case where one exposure area 502 includes 2×2 (four) chip areas 512. As set forth above, when the exposure area 501 or 502 is located near the outer periphery (edge) of the wafer 400, the focus-leveling control may not be sufficiently performed.

In the case of FIG. 5A, when the focus-leveling measurement points (light beam spots) corresponding to a given chip area is located in the focus control exclusion region 420, the chip areas 533 may have a risk of insufficient focus-leveling control because the focus-leveling measurement data correspond to the given chip areas 533 are not used. It is noted that when the measurement point is located out of the outer periphery of the wafer 400, no measurement is performed for the chip areas 535.

In the case shown in FIG. 5A, for the exposure area 521, two chip areas, which are located in the focus control exclusion area 415 and would otherwise be good chips, may have a risk of insufficient focus control, and 22 chip areas are valid chip areas 531. More specifically, the chip areas corresponding to the matrix (3, 7) and (3, 8), where (x, y) corresponds to the row and column of the multiple chips within the exposure area, are invalid chip areas 533, and the focus-leveling measurement data corresponding to the invalid chip areas 533 are not used in the focus-leveling control during the exposure. Thus, these chip areas may be subjected to the risk of insufficient focus control, and thus are excluded from "good" chips.

For the exposure area 522, seven chip areas, which are located in the focus control exclusion area 415 and would otherwise be good chips, may have a risk of insufficient focus control, and 17 chip areas are valid chip areas 531. More specifically, the chip areas corresponding to the matrix (1, 5), (1, 6), (2, 4), (3, 3), (3, 4), (4, 2) and (4, 3) are invalid chip areas 533, and the focus-leveling measurement data corresponding to the invalid chip areas 533 are not used in the focus-leveling control during the exposure. Thus, these chip areas may be subjected to the risk of insufficient focus control, thus be excluded from "good" chips.

For the exposure area 523, six chip areas, which are located in the focus control exclusion area 415 and would otherwise be good chips, may have a risk of insufficient focus control, and 18 chip areas are valid chip areas 531. More specifically, the chip areas corresponding to the matrix (2, 6), (3, 4), (3, 5), (4, 1), (4, 2) and (4, 3) are invalid chip areas 533, and the focus-leveling measurement data corresponding to the invalid chip areas 533 are not used in the focus-leveling control during the exposure. Thus, these chips areas may be subjected to the risk of insufficient focus control, and thus are excluded from the "good" chips.

In the exposure areas 521, 522 and 523, the chip areas located on or outside of the outer periphery of the effective region of the wafer 400 are considered as invalid chips and no focus-leveling data are measured or, even if measured, the data is not used in the focus-leveling control. In some embodiments, the effective region of the wafer 400 is set smaller than the physical periphery of the wafer 400. The effective region of the wafer 400 is set in consideration of an edge cut amount in photo resist coating and/or a mechanical clamping margin in a film deposition device or an etching device. In some embodiments, the effective region of the wafer is set smaller by about 2 mm to about 15 mm in diameter than the wafer. When the wafer 400 is 300 mm diameter wafer, the effective region of the wafer 400 (the diameter) is set in a range from 285 mm to 295 mm, in some embodiments. For simplicity, the present drawings show the edge of the wafer as the outer periphery of the effective region of the wafer 400.

The number of such risk-bearing chip areas depends on the matrix arrangement of the multiple chip areas in one exposure area.

In the case shown in FIG. 5B, 2×2 (four) chip areas 512 are included in one exposure area 502. For the exposure area 541, one chip area, which is located in the focus control exclusion area 415 and would otherwise be a good chip, may have a risk of insufficient focus control, one chip area overlaps the outer periphery of the effective region of the wafer 400, and only two chip areas are good chip areas 551 (with sufficient focus-leveling control). More specifically, the chip area corresponding to the matrix (1, 2) is an invalid chip area 553, and the focus-leveling measurement data corresponding to the invalid chip area 553 are not used in the focus-leveling control during the exposure. Thus, the chip areas may be subjected to the risk of insufficient focus control, and thus are excluded from the "good" chips.

For the exposure area 542, one chip area, which is located in the focus control exclusion area 415 and would otherwise be a good chip, may have a risk of insufficient focus control, and no chip areas are a good chip area 551 (with sufficient focus-leveling control). More specifically, the chip area corresponding to the matrix (1, 1) is an invalid chip area 553, and the focus-leveling measurement data corresponding to the invalid chip area 553 are not used in the focus-leveling control during the exposure. Thus, the chip areas may be subjected to the risk of insufficient focus control, and thus are excluded from the "good" chips.

Further, for the exposure area 543, one chip area, which is located in the focus control exclusion area 415 and would otherwise be a good chip, may have a risk of insufficient focus control, and three chip areas are good chip areas 551 (with sufficient focus-leveling control). More specifically, the chip area corresponding to the matrix (2, 2) is an invalid chip area 553, and the focus-leveling measurement data corresponding to the invalid chip area 553 are not used in the focus-leveling control during the exposure. Thus, the chip areas may be subjected to the risk of insufficient focus control, and thus are excluded from the "good" chips.

In the exposure areas 541, 542 and 543, the chip areas located on or outside of the outer periphery of the effective region of the wafer 400 are considered as invalid chips 553 and no focus-leveling data are measured or, even if measured, the data is not used in the focus-leveling control. It is noted that when the measurement point is located out of the outer periphery of the wafer 400, no measurement is performed for the chip areas 555.

As set forth above, when a simple circular boundary between the focus control effective region and the focus control exclusion region is set, many chip areas are subjected to insufficient focus-leveling control, and thus a yield of the chips would decrease.

According to one aspect of the present disclosure, the focus control exclusion region is not fixed as a circular shape, but is flexibly set in accordance with an exposure map and a chip layout within the exposure map.

Figures 6A, 6B:
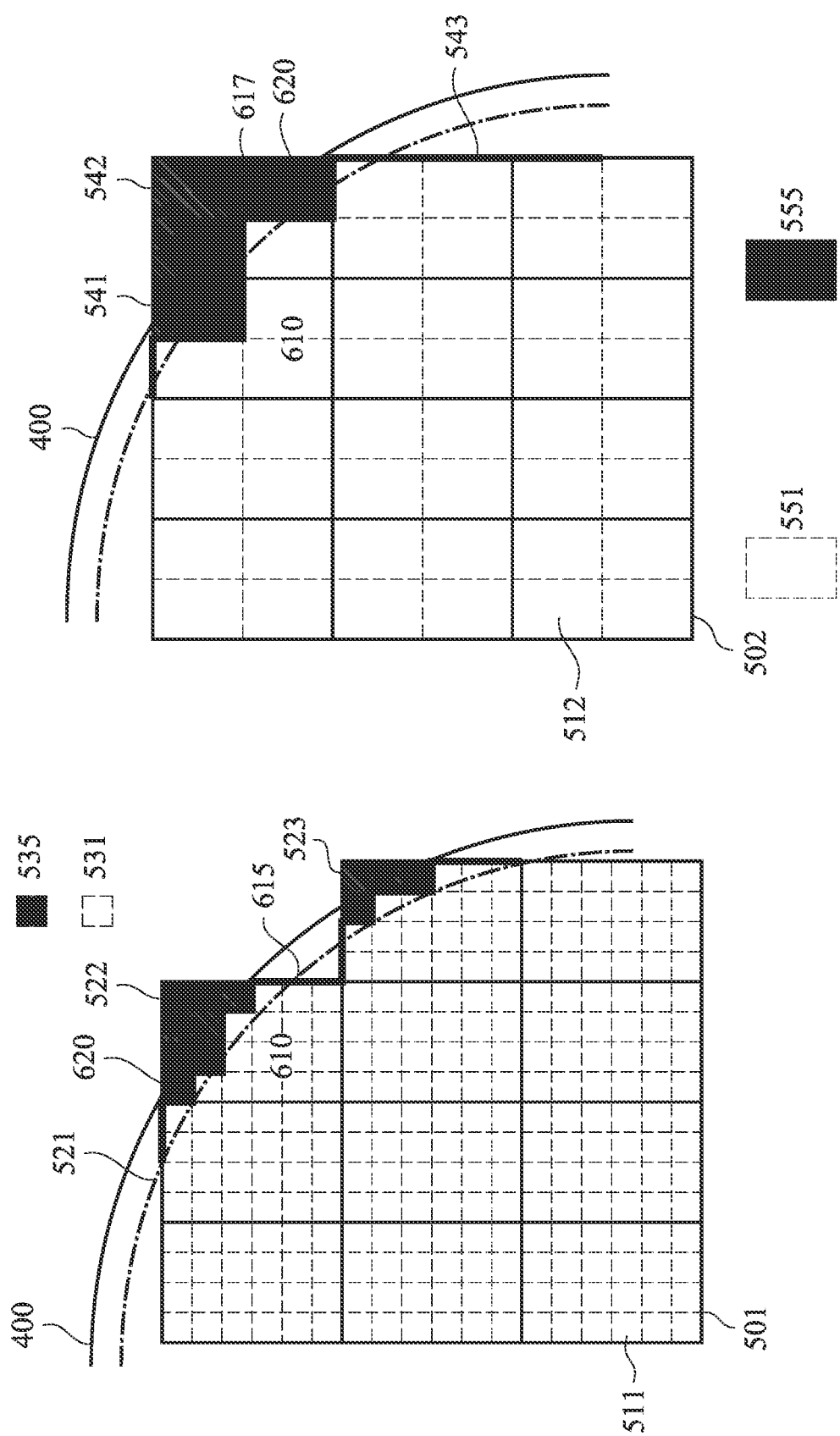
FIGS. 6A and 6B show a concept of measuring and controlling focus-leveling according to embodiments of the present disclosure.

As shown in FIGS. 6A and 6B, the boundary 615 or 617 between the focus control effective region 610 and the focus control exclusion region 620 is set along the chip area boundaries. In some embodiments, as long as a chip area is located within the periphery of the effective region of the wafer 400, the chip area is classified as a valid chip area 531 or 551 and is included in the focus control effective region 610. As set forth above, the focus-leveling measurement data corresponding to the valid chip areas 531 or 551 are used for the focus-leveling control during the exposure. When a part of or all of the chip area is located on or outside of the outer periphery of the effective region of the wafer 400, the chip area is considered as an invalid chip area 535 or 555, and the area corresponding to the invalid chip areas is set as the focus control exclusion region 620.

In the case of FIG. 6A, compared with FIG. 5A, the exposure area 521 does not include any invalid chip area. The chip areas corresponding to the matrix (3, 6) and (3, 7) are located within the outer periphery of the effective region of the wafer 400, and thus valid chip areas 531. The focus-leveling measurement data corresponding to these valid chip areas 531 are used in the focus-leveling control during the exposure. Thus, the chip areas would likely be manufactured as "good" chips. In other words, compared with a circular setting 515 of the focus control exclusion region 520 as shown in FIG. 5A, two chips are saved as a good chip.

Similarly, the exposure area 522 includes eight invalid chip areas 535 (1, 6), (2, 5), (2, 6), (3, 5), (3, 6), (4, 4), (4, 5) and (4, 6), which are located on or outside of the outer periphery of the effective region of the wafer 400. The chip areas corresponding to the matrix (1, 5), (2, 4), (3, 3), (3, 4), (4, 2) and (4, 3) are located within the outer periphery of the effective region of the wafer 400, and are valid chip areas 531. The focus-leveling measurement data corresponding to these valid chip areas 531 are used in the focus-leveling control during the exposure. Thus, these chips areas would likely be manufactured as "good" chips. In other words, compared with a circular setting 515 of the focus control exclusion region 520 as shown in FIG. 5A, six chips are saved as good chips.

Further, the exposure area 523 includes four invalid chip areas 535 (3, 6), (4, 4), (4, 5), and (4, 6), which are located on or outside of the outer periphery of the effective region of the wafer 400. The chip areas corresponding to the matrix (2, 6), (3, 4), (3, 5), (4, 1), (4, 2) and (4, 3) are located within the outer periphery of the wafer, and are valid chip areas 531. The focus-leveling measurement data corresponding to these valid chip areas 531 are used in the focus-leveling control during the exposure. Thus, these chips areas would likely be manufactured as "good" chips. In other words, compared with a circular setting of the focus control exclusion region as shown in FIG. 5A, six chips are saved as good chips.

Although FIG. 6A shows only a part of the boundary 615 between the focus control effective region and the focus control exclusion region, the boundary is set for the entire exposure map over the wafer.

The same or similar effects can be obtained for the case of a 2×2 chip matrix. As shown in FIG. 6B, for the exposure area 541, one chip area can be saved as a valid chip area 551 compared with a circular setting of the focus control exclusion region as shown in FIG. 5B, for the exposure area 542, one chip area can be saved as a valid chip area 551 compared with a circular setting of the focus control exclusion region as shown in FIG. 5B, and for the exposure area 543, one chip area can be saved as a valid chip area 551 compared with a circular setting of the focus control exclusion region as shown in FIG. 5B. The chip areas located on or outside of the outer periphery of the effective region of the wafer 400 remain invalid chip areas 555.

In the foregoing embodiments, the boundary 615 and/or 617 between the focus control effective region 610 and the focus control exclusion region 620 is not circular, and is not fixed. In some embodiments, the boundary 615 and/or 617 between the focus control effective region 610 and the focus control exclusion region 620 has multiple corners. The multiple corners include 90 degree corners and 270 degree corners. In other words, the boundary between the focus control effective region and the focus exclusion region is a zig-zag pattern.

Further, as shown in FIGS. 6A and 6B, different focus control effective region 610 and focus control exclusion region 620 can be set for different exposure maps and chip area layout in the exposure area.

Figure 7:
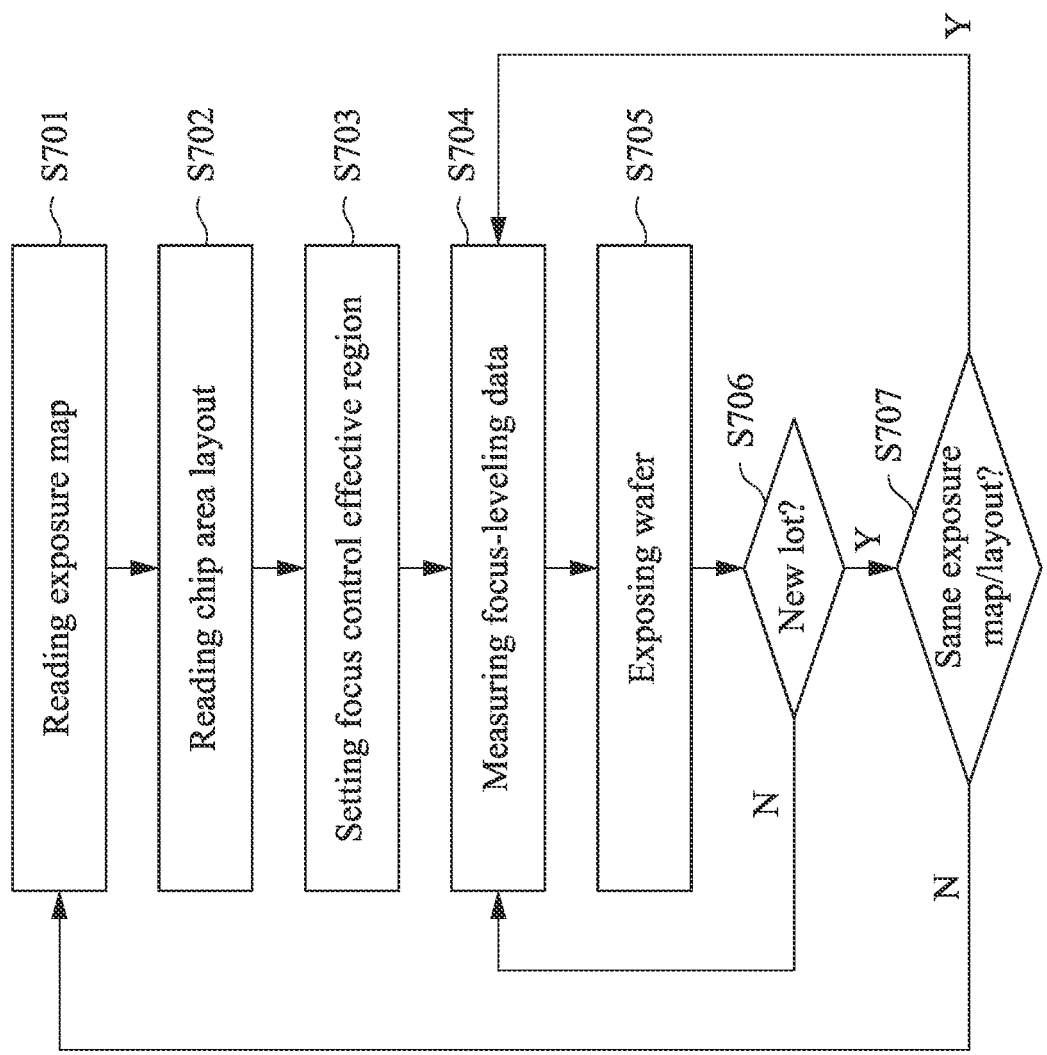
FIG. 7 shows a flow chart of an exposure operation according to embodiments of the present disclosure.

FIG. 7 shows an operational flow of exposing wafer by using a optical scanner according to an embodiment of the present disclosure. The operational flow of FIG. 7 can be realized by a program or software executed by a processor (computer). In some embodiments, a non-transitory computer readable medium (e.g., 65 shown in FIG. 1) stores a program, and when the program is executed by one or more processors of an exposure apparatus, the program causes the exposure apparatus to perform the operations of FIG. 7. The non-transitory computer readable medium includes a hard disk drive, an optical disk, a flash memory, and any other suitable memories.

Figure 8B:
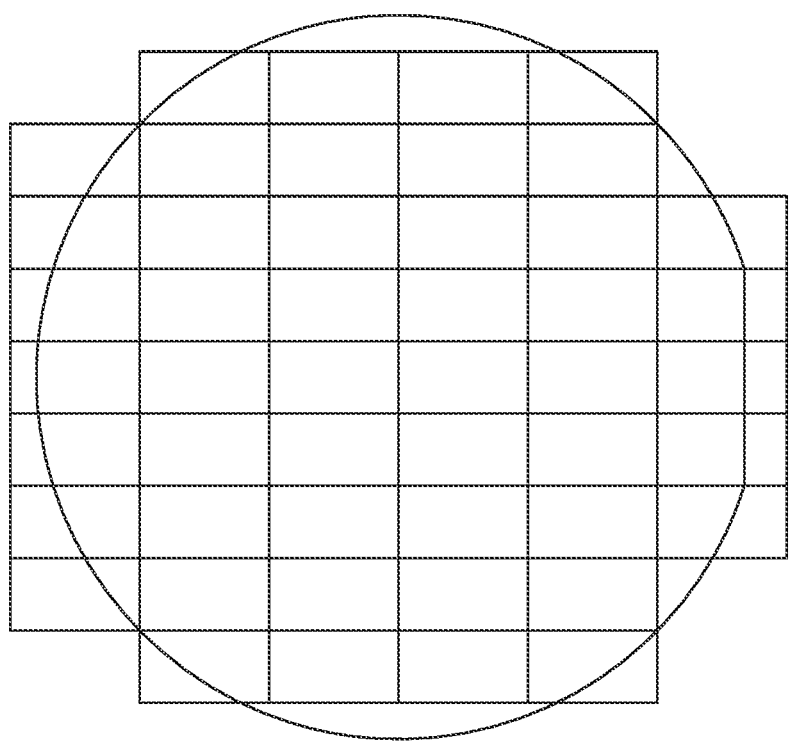
FIGS. 8A and 8B show various exposure maps related to embodiments of the present disclosure.
Figure 8A:
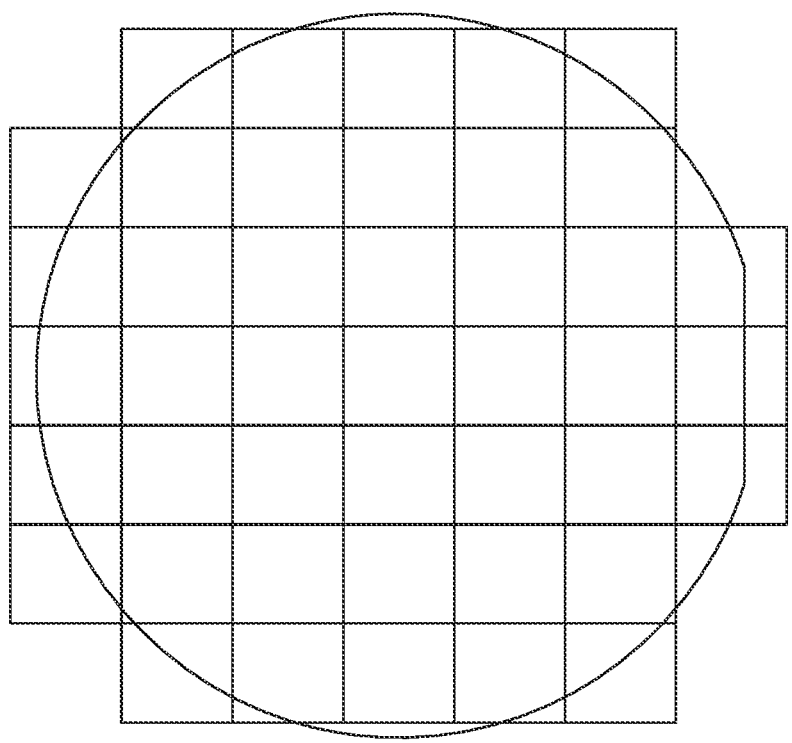

In step S701, an exposure map is read from a memory. The exposure map defines a matrix of exposure areas (an exposure area is one scan area in the scanner) and includes a size of the exposure area and the numbers of rows and columns of the exposure areas over a wafer. FIGS. 8A and 8B shows various exposure maps. FIG. 8A show a 9×6 matrix of the exposure areas, and FIG. 8B show a 7×7 matrix of the exposure areas.

Figure 9G:
FIGS. 9A, 9B, 9C, 9D, 9E, 9F and 9G show various chip area layout related to embodiments of the present disclosure.
Figure 9C:
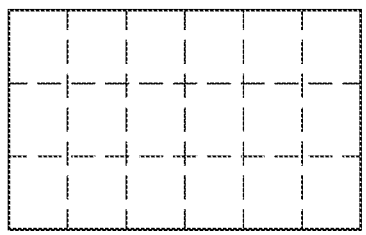
Figure 9F:
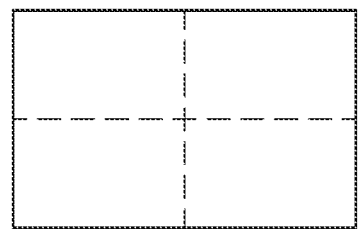
Figure 9B:
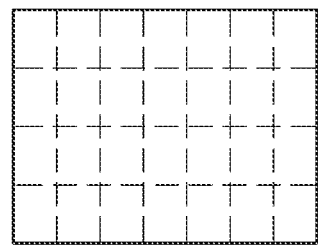
Figure 9E:
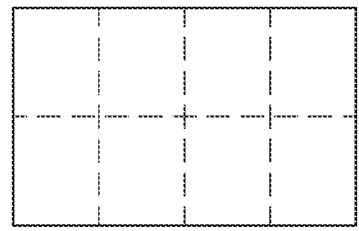
Figure 9A:
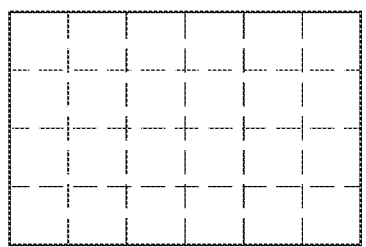
Figure 9D:
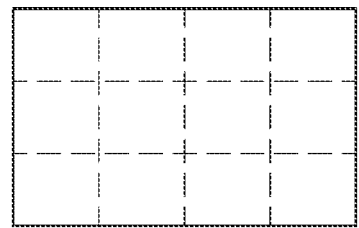

Then, in step S702, a chip area layout is read from the memory. The chip layout defines matrix of chip areas within one exposure area, and includes a size of the chip area and the numbers of rows and columns of the chip areas within one exposure area. One chip area corresponds to one semiconductor die (chip). FIGS. 9A-9G show various layouts of the chips areas. FIG. 9A shows a 4×6 matrix, FIG. 9B shows a 4×7 matrix, FIG. 9C shows a 3×6 matrix, FIG. 9D shows a 3×4 matrix, FIG. 9E shows a 2×4 matrix and FIG. 9F shows a 2×2 matrix. FIG. 9G shows a single chip area within one exposure area.

In step S703, by using the exposure map and the chip area layout, the boundary between the focus control effective region and the focus control exclusion region similar to FIGS. 6A and 6B is defined. In some embodiments, it is determined whether each exposure area overlaps the periphery of the effective region of the wafer. Then, for the exposure areas overlapping the periphery of the effective region of the wafer, it is determined whether each chip area overlaps the periphery of the effective region of the wafer. When the entire chip area is within the periphery of the effective region of the wafer, the chip area is determined as a part of the focus control effective region.

Then, a wafer coated with a photo resist from a "lot" of wafers (e.g., 25 or 50 wafers) is loaded into the optical scanner.

In step S704, focus-leveling measurement over the wafer is performed, and then exposure (scanning) is performed in step S705. In the exposure, the focus-leveling data measured in step S704 is utilized. As set forth above, when the measuring points are located in the focus control exclusion region, the measurement data thereof are not used in the exposure step S705 in some embodiments. In other embodiments, when the measuring points are located in the focus control exclusion region, the focus-leveling measurement is not performed or measured data is not stored in step S704. In other embodiments, as explained with FIG. 3, the focus-leveling measurement is performed just before exposing the exposure area.

The wafers are exposed one-by-one until all wafers in the lot are exposed (step S706 to step S704). When the last wafer is exposed ("Y" at step S706), the next lot of wafers is set to the optical scanner. When the next lot is for the same semiconductor chips having the same exposure map and the chip area layout ("Y" at step S707), the exposure of the wafer is performed using the previously set focus control effective region data. When the next lot is for a different semiconductor chip having a different exposure map and chip area layout ("N" at step S707), a new exposure map and a new chip area layout are read from a memory, and a new focus control effective region is set.

Figure 10A:
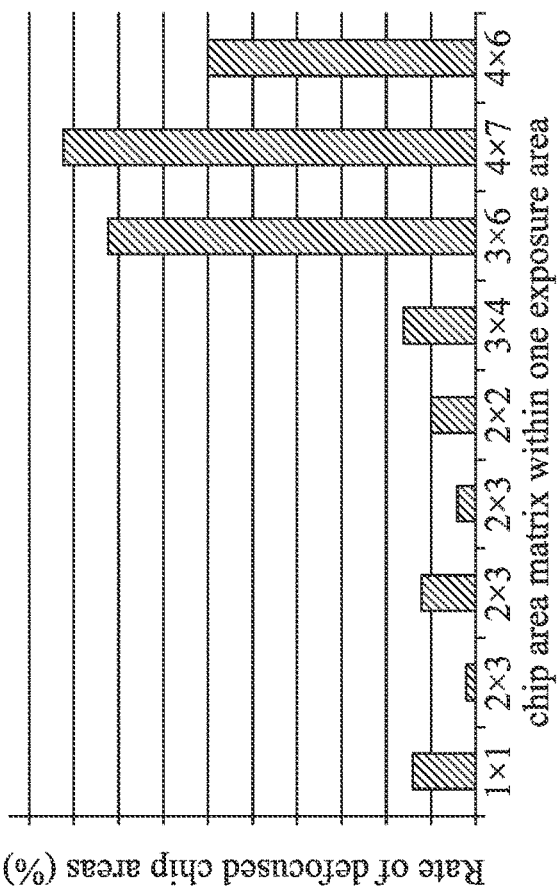
FIGS. 10A and 10B show defocus-risk chip areas related to embodiments of the present disclosure.
Figure 10B:
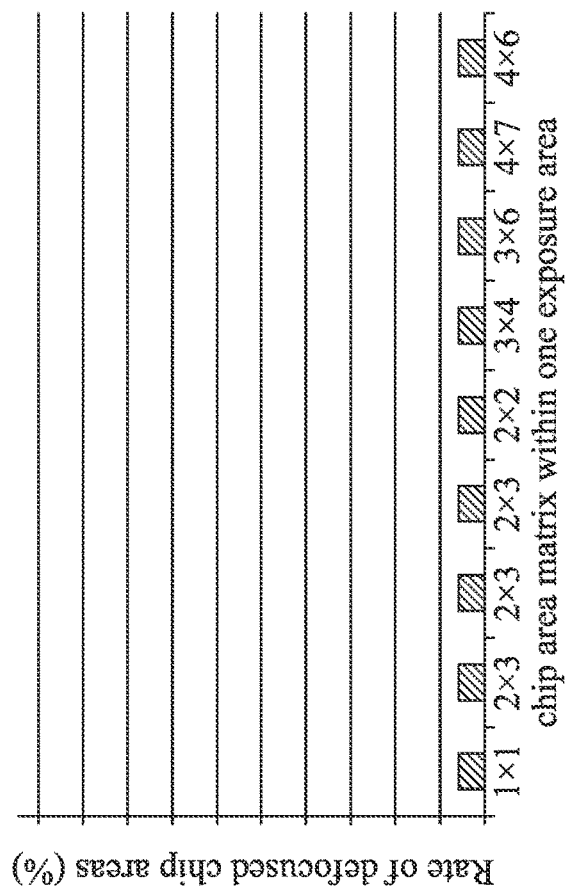

FIGS. 10A and 10B show one of the advantageous effects of the embodiments of the present disclosure. FIG. 10A shows a rate of the defocused chip areas according to experimentation in the case where a circular boundary between the focus control effective region and the focus control exclusion region is set similar to FIGS. 5A and 5B. The horizontal axis shows chip area matrix within one exposure area. The sizes of the chip areas may be different from each other. As shown in FIG. 10A, when many chip areas are arranged in one exposure area, more "bad" chips occur.

FIG. 10B shows a simulated result when the flexible and non-circular boundary between the focus control effective region and the focus control exclusion region is set similar to FIGS. 6A and 6B. Compared with FIG. 10A, the number of the "bad" chips can be reduced, which in turn increases the number of "good" chips.

In the foregoing embodiments, an optical scanner is employed. However, the foregoing embodiments can be applied to an optical stepper and an extreme ultra violet (EUV) scanner.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

In the present disclosure, by flexibly setting the boundary between the focus control effective region and the focus control exclusion region depending on the exposure map and the chip area layout, it is possible reduce the number of "bad" chips caused by insufficient focus-leveling control near the edge of the wafer.

In accordance with one aspect of the present disclosure, in a method executed in an exposure apparatus, a focus control effective region and a focus control exclusion region are set based on an exposure map and a chip area layout within an exposure area. Focus-leveling data are measured over a wafer. A photo resist layer on the wafer is exposed with an exposure light by using the exposure apparatus. A plurality of chip areas are included in the exposure area. When a chip area of the plurality of chip areas is located within an effective region of a wafer, the chip area is included in the focus control effective region, and when a part of or all of a chip area of the plurality of chip areas is located on or outside a periphery of the effective region of the wafer, the chip area is included in the focus control exclusion region. In the exposing, a focus-leveling is controlled by using the focus-leveling data measured at the focus control effective region. In one or more of the foregoing and following embodiments, the focus-leveling data measured at the focus control exclusion region are not used to control the focus-leveling. In one or more of the foregoing and following embodiments, a boundary between the focus control effective region and the focus control exclusion region is not circular. In one or more of the foregoing and following embodiments, the boundary between the focus control effective region and the focus control exclusion region has multiple corners. In one or more of the foregoing and following embodiments, the multiple corners include 90 degree corners and 270 degree corners. In one or more of the foregoing and following embodiments, the boundary between the focus control effective region and the focus control exclusion region is set along edges of some of the plurality of chip areas. In one or more of the foregoing and following embodiments, different focus control effective regions and focus control exclusion regions are set for different exposure maps. In one or more of the foregoing and following embodiments, different boundaries between the focus control effective regions and the focus control exclusion regions are set for different chip layouts in the exposure area. In one or more of the foregoing and following embodiments, the measuring focus-leveling data is not performed for the focus control exclusion region. In one or more of the foregoing and following embodiments, the exposure apparatus is one of an optical scanner, an optical stepper and an extreme ultra violet scanner. In one or more of the foregoing and following embodiments, a boundary between the focus control effective region and the focus control exclusion region is set within a periphery of the effective region of the wafer, the effective region of the wafer has a circular shape, and a diameter of the effective region of the wafer is 2-15 mm smaller than a diameter of the wafer.

In accordance with another aspect of the present disclosure, in a method executed in an exposure apparatus, a first exposure map and a first chip area layout within a first exposure area for a first lot of wafers is obtained. A first focus control effective region and a first focus control exclusion region are set based on the first exposure map and the first chip area layout. First focus-leveling data are measured over a wafer of the first lot. A photo resist layer on the wafer of the first lot is exposed with an exposure light by using the exposure apparatus. After all wafers in the first lot are exposed, a second exposure map and a second chip area layout within a second exposure area for a second lot of wafers are obtained. A second focus control effective region and a second focus control exclusion region are set based on the second exposure map and the second chip area layout. Second focus-leveling data over a wafer of the second lot are measured. A photo resist layer on the wafer of the second lot is exposed with an exposure light by using the exposure apparatus. The first focus control effective region and the first focus control exclusion are different from the second focus control effective region and a second focus control exclusion, respectively. In one or more of the foregoing and following embodiments, in the exposing the photo resist layer on the wafer of the first lot, a focus-leveling is controlled by using the first focus-leveling data measured at the first focus control effective region, and in the exposing the photo resist layer on the wafer of the second lot, a focus-leveling is controlled by using the second focus-leveling data measured at the second focus control effective region. In one or more of the foregoing and following embodiments, the first focus-leveling data measured at the first focus control exclusion region are not used to control the focus-leveling in the exposing the photo resist layer on the wafer of the first lot, and the second focus-leveling data measured at the second focus control exclusion region are not used to control the focus-leveling in the exposing the photo resist layer on the wafer of the second lot. In one or more of the foregoing and following embodiments, at least one of a first boundary between the first focus control effective region and the first focus control exclusion region and a second boundary between the second focus control effective region and the second focus control exclusion region is not circular. In one or more of the foregoing and following embodiments, at least one of a first boundary between the first focus control effective region and the first focus control exclusion region and a second boundary between the second focus control effective region and the second focus control exclusion region has multiple corners. In one or more of the foregoing and following embodiments, wherein the multiple corners include 90 degree corners and 270 degree corners. In one or more of the foregoing and following embodiments, a first boundary between the first focus control effective region and the first focus control exclusion region and a second boundary between the second focus control effective region and the second focus control exclusion region are set within a periphery of the effective region of the wafer. In one or more of the foregoing and following embodiments, the effective region of the wafer has a circular shape, and a diameter of the effective region of the wafer is 2-15 mm smaller than a diameter of the wafer.

In accordance with another aspect of the present disclosure, in a method executed in an optical scanner, an exposure map and a chip area layout within an exposure area are obtained. A focus control effective region and a focus control exclusion region are set based on the exposure map and the chip area layout. Exposing a photo resist layer on the wafer with an exposure light by using the optical scanner using the set focus control effective region. a plurality of chip areas are included in the exposure area. When a chip area of the plurality of chip areas is located within an effective region of a wafer, the chip area is included in the focus control effective region, and when a part of or all of a chip area of the plurality of chip areas is located on or outside a periphery of the effective region of the wafer, the chip area is included in the focus control exclusion region. In the exposing, a focus-leveling is controlled at the focus control effective region.

In accordance with another aspect of the present disclosure, an optical scanner includes a projection lens, a wafer stage on which a wafer coated with a photo resist layer is placed, a focus-leveling sensor for detecting a height and a tilt of the wafer, a controller for controlling the wafer stage and the focus-leveling sensor, and a memory. The memory is configured to store an exposure map set over a wafer set and a chip area layout within an exposure area. The controller is configured to set a focus control effective region and a focus control exclusion region based on the exposure map and the chip area layout. An exposure area corresponding to one scan is set by the optical scanner. A plurality of chip areas are included in the exposure area. When a chip area of the plurality of chip areas is located within an effective region of a wafer, the chip area is included in the focus control effective region, and when a part of or all of a chip area of the plurality of chip areas is located on or outside a periphery of the effective region of the wafer, the chip area is included in the focus control exclusion region. In the exposing, a focus-leveling is controlled by using the focus-leveling data measured at the focus control effective region. In one or more of the foregoing and following embodiments, the focus-leveling data measured at the focus control exclusion region are not used. In one or more of the foregoing and following embodiments, a boundary between the focus control effective region and the focus control exclusion region is not circular. In one or more of the foregoing and following embodiments, the boundary between the focus control effective region and the focus control exclusion region has multiple corners. In one or more of the foregoing and following embodiments, the multiple corners include 90 degree corners and 270 degree corners. In one or more of the foregoing and following embodiments, the boundary between the focus control effective region and the focus control exclusion region is set along edges of some of the plurality of chip areas. In one or more of the foregoing and following embodiments, different focus control effective regions and focus control exclusion regions are set for different exposure maps. In one or more of the foregoing and following embodiments, different boundaries between the focus control effective regions and the focus control exclusion regions are set for different chip layouts in the exposure area. In one or more of the foregoing and following embodiments, the measuring focus-leveling data is not performed for the focus control exclusion region. In one or more of the foregoing and following embodiments, a boundary between the focus control effective region and the focus control exclusion region is set within a periphery of the effective region of the wafer, the effective region of the wafer has a circular shape, and a diameter of the effective region of the wafer is 2-15 mm smaller than a diameter of the wafer.

In accordance with another aspect of the present disclosure, a An exposure apparatus includes a projection lens, a wafer stage on which a wafer coated with a photo resist layer is placed, a focus-leveling sensor for detecting a height and a tilt of the wafer, a controller for controlling the wafer stage and the focus-leveling sensor, and a non-transitory memory storing a program. When the program is executed by one or more processors of the controller, causes the exposure apparatus to perform: obtaining an exposure map and a chip area layout within an exposure area; setting a focus control effective region and a focus control exclusion region based on the exposure map and the chip area layout; measuring focus-leveling data over a wafer; and exposing a photo resist layer on the wafer with an exposure light by using the exposure apparatus. A plurality of chip areas are included in the exposure area. When a chip area of the plurality of chip areas is located within an effective region of a wafer, the chip area is included in the focus control effective region, and when a part of or all of a chip area of the plurality of chip areas is located on or outside a periphery of the effective region of the wafer, the chip area is included in the focus control exclusion region. In the exposing, a focus-leveling is controlled by using the focus-leveling data measured at the focus control effective region. In one or more of the foregoing and following embodiments, the focus-leveling data measured at the focus control exclusion region are not used. In one or more of the foregoing and following embodiments, a boundary between the focus control effective region and the focus control exclusion region is not circular. In one or more of the foregoing and following embodiments, the boundary between the focus control effective region and the focus control exclusion region has multiple corners. In one or more of the foregoing and following embodiments, the boundary between the focus control effective region and the focus control exclusion region is set along edges of some of the plurality of chip areas. In one or more of the foregoing and following embodiments, different focus control effective regions and focus control exclusion regions are set for different exposure maps. In one or more of the foregoing and following embodiments, different boundaries between the focus control effective region and the focus control exclusion region are set for different chip layouts in the exposure area. In one or more of the foregoing and following embodiments, a boundary between the focus control effective region and the focus control exclusion region is set within a periphery of the effective region of the wafer, the effective region of the wafer has a circular shape, and a diameter of the effective region of the wafer is 2-15 mm smaller than a diameter of the wafer.

In accordance with another aspect of the present disclosure, an exposure apparatus includes a projection lens, a wafer stage on which a wafer coated with a photo resist layer is placed, a focus-leveling sensor for detecting a height and a tilt of the wafer, a controller for controlling the wafer stage and the focus-leveling sensor, and a non-transitory memory storing a program. When the program is executed by one or more processors of the controller, causes the exposure apparatus to perform: obtaining a first exposure map and a first chip area layout within a first exposure area for a first lot of wafers; setting a first focus control effective region and a first focus control exclusion region based on the first exposure map and the first chip area layout; measuring first focus-leveling data over a wafer of the first lot; exposing a photo resist layer on the wafer of the first lot with an exposure light by using the exposure apparatus; after all wafers in the first lot are exposed, obtaining a second exposure map and a second chip area layout within a second exposure area for a second lot of wafers; setting a second focus control effective region and a second focus control exclusion region based on the second exposure map and the second chip area layout; measuring second focus-leveling data over a wafer of the second lot; and exposing a photo resist layer on the wafer of the second lot with an exposure light by using the exposure apparatus. The first focus control effective region and the first focus control exclusion are different from the second focus control effective region and a second focus control exclusion, respectively.

In accordance with another aspect of the present disclosure, a non-transitory computer readable medium stores a program. When the program is executed by one or more processor of an exposure apparatus, the program causes the exposure apparatus to perform: obtaining an exposure map and a chip area layout within an exposure area. A focus control effective region and a focus control exclusion region are set based on the exposure map and the chip area layout. Focus-leveling data are measured over a wafer. A photo resist layer on the wafer is exposed with an exposure light by using the exposure apparatus. A plurality of chip areas are included in the exposure area. When a chip area of the plurality of chip areas is located within an effective region of a wafer, the chip area is included in the focus control effective region, and when a part of or all of a chip area of the plurality of chip areas is located on or outside a periphery of the effective region of the wafer, the chip area is included in the focus control exclusion region. In the exposing, a focus-leveling is controlled by using the focus-leveling data measured at the focus control effective region.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method executed in an exposure apparatus, comprising:
    obtaining a wafer exposure map, which defines a matrix of exposure fields per wafer and a matrix of sub-areas within one exposure field;
    defining, based on the wafer exposure map, valid sub-areas and invalid sub-areas; and
    exposing one exposure field of the matrix of exposure field, wherein:
    the exposing one exposure field comprises:
        measuring focus-leveling data by using a focus-leveling sensor providing a plurality of laser beams arranged in an X direction, while moving the wafer in a Y direction; and
        exposing a part of a scanning area by an exposing light having a slit shape extending in the X direction by using one or more measured focus-leveling data, while moving the wafer in the Y direction, and
    the measured focus-leveling data corresponding to the valid sub-areas are used in the exposing to control focus-leveling, and the measured focus-leveling data corresponding to the invalid sub-areas are not used in the exposing.

2. The method of claim 1, wherein:
    the valid sub-areas are determined when an entirety of a given sub-area is within a first circular perimeter,
    the valid sub-areas include at least one first sub-area an entirety of which is within a second circular perimeter having a smaller diameter than the first circular perimeter, and at least one second sub-area which overlaps the second circular perimeter, and each of the invalid sub-areas overlaps the first circular perimeter.

3. The method of claim 2, wherein the first circular perimeter corresponds to an outer perimeter of the wafer.

4. The method of claim 3, wherein the diameter of the second circular perimeter is 2-15 mm smaller than the diameter of the first circular perimeter.

5. The method of claim 2, wherein the exposing one exposure field is repeated to expose all the matrix of the exposure field.

6. The method of claim 2, wherein when an entirety of one exposure field is within the second circular perimeter, the sub-areas of the one exposure field are valid sub-areas.

7. The method of claim 1, wherein the exposure light is an extreme ultra violet light.

8. An optical scanner, comprising:
projection optics;
a wafer stage on which a wafer coated with a photo resist layer is placed;
a focus-leveling sensor for detecting a height and a tilt of the wafer; and
a controller for controlling the wafer stage and the focus-leveling sensor, and including a processor and a memory storing a program, wherein:
the program, when executed by the processor, causes the controller to perform:
obtaining a wafer exposure map, which defines a matrix of exposure fields per wafer and a matrix of sub-areas within one exposure field;
defining, based on the wafer exposure map, valid sub-areas when an entirety of a given sub-area is within a first circular perimeter, the valid sub-areas including at least one first sub-area an entirety of which is within a second circular perimeter having a smaller diameter than the first circular perimeter, and at least one second sub-area which overlaps the second circular perimeter, and defining, based on the wafer exposure map, invalid sub-areas each of which overlaps the first circular perimeter; and
exposing one exposure field of the matrix of exposure field, the exposing one exposure field comprises:
measuring focus-leveling data by using the focus-leveling sensor providing a plurality of laser beams arranged in an X direction, while moving the wafer in a Y direction; and
exposing a part of a scanning area by an exposing light having a slit shape extending in the X direction by using one or more measured focus-leveling data, while moving the wafer in the Y direction, and
the measured focus-leveling data corresponding to valid sub-areas are used in the exposing to control focus-leveling, and the measured focus-leveling data corresponding to the invalid sub-areas are not used in the exposing.

9. The optical scanner of claim 8, wherein the first circular perimeter corresponds to an outer perimeter of the wafer.

10. The optical scanner of claim 9, wherein the diameter of the second circular perimeter is 2-15 mm smaller than the diameter of the first circular perimeter.

11. The optical scanner of claim 8, wherein the exposing one exposure field is repeated to expose all the matrix of the exposure field.

12. The optical scanner of claim 8, wherein when an entirety of one exposure field is within the second circular perimeter, the sub-areas of the one exposure field are valid sub-areas.

13. The optical scanner of claim 8, wherein the exposure light is an extreme ultra violet light.

14. The optical scanner of claim 8, wherein the exposure light is a deep ultra violet light.

15. A method executed in an exposure apparatus, comprising:
obtaining a wafer exposure map, which defines a matrix of exposure fields per wafer and a matrix of sub-areas within one exposure field;
defining a focus control effective region and a focus control exclusion region, based on the wafer exposure map;
exposing one exposure field of the matrix of exposure field, wherein:
a boundary between the focus control effective region and the focus control exclusion region is across at least one exposure field,
the exposing one exposure field comprises:
measuring focus-leveling data by using a focus-leveling sensor providing a plurality of laser beams arranged in an X direction, while moving the wafer in a Y direction; and
exposing a part of a scanning area by an exposing light having a slit shape extending in the X direction by using one or more measured focus-leveling data, while moving the wafer in the Y direction, and
the measured focus-leveling data corresponding to sub-areas within the focus control effective region are used in the exposing to control focus-leveling, and the measured focus-leveling data corresponding to sub-areas within the focus control exclusion region are not used in the exposing.

16. The method of claim 15, wherein the defining the focus control effective region and the focus control exclusion region comprises:
defining, based on the wafer exposure map, valid sub-areas when an entirety of a given sub-area is within a first circular perimeter, the valid sub-areas including at least one first sub-area an entirety of which is within a second circular perimeter having a smaller diameter than the first circular perimeter, and at least one second sub-area which overlaps the second circular perimeter;
defining, based on the wafer exposure map, invalid sub-areas each of which overlap the first circular perimeter; and
determining the focus control effective region to include all valid sub-areas, and the focus control exclusion region to include all invalid sub-areas.

17. The method of claim 16, wherein:
the first circular perimeter corresponds to an outer perimeter of the wafer, and
the diameter of the second circular perimeter is 2-15 mm smaller than the diameter of the first circular perimeter.

18. The method of claim 17, wherein the boundary between the focus control effective region and the focus control exclusion region is not circular.

19. The method of claim 18, wherein the boundary between the focus control effective region and the focus control exclusion region has multiple corners.

20. The method of claim 16, wherein the exposure light is an extreme ultra violet light.

* * * * *